United States Patent
Liu et al.

(10) Patent No.: US 11,742,866 B2
(45) Date of Patent: Aug. 29, 2023

(54) METHOD FOR UP-CONVERTING CLOCK SIGNAL, CLOCK CIRCUIT AND DIGITAL PROCESSING DEVICE

(71) Applicant: SHENZHEN MICROBT ELECTRONICS TECHNOLOGY CO., LTD., Guangdong (CN)

(72) Inventors: Jianbo Liu, Guangdong (CN); Weibin Ma, Guangdong (CN); Lihong Huang, Guangdong (CN); Zuoxing Yang, Guangdong (CN); Haifeng Guo, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/621,138

(22) PCT Filed: Jun. 22, 2021

(86) PCT No.: PCT/CN2021/101449
§ 371 (c)(1),
(2) Date: Dec. 20, 2021

(87) PCT Pub. No.: WO2021/259235
PCT Pub. Date: Dec. 30, 2021

(65) Prior Publication Data
US 2022/0352898 A1    Nov. 3, 2022

(30) Foreign Application Priority Data

Jun. 23, 2020   (CN) .......................... 202010582032.2

(51) Int. Cl.
*H03D 3/24*      (2006.01)
*H03L 7/099*     (2006.01)
(Continued)

(52) U.S. Cl.
CPC ............ *H03L 7/0992* (2013.01); *H03L 7/089* (2013.01); *H03L 7/093* (2013.01)

(58) Field of Classification Search
CPC ....... H03L 7/0992; H03L 7/093; H03L 7/089; H03L 7/18; G06F 1/08
(Continued)

(56) References Cited

U.S. PATENT DOCUMENTS 4,870,299 A    9/1989  Chen
5,142,247 A *  8/1992  Lada, Jr. ................... H03L 7/18
                                                              331/25
(Continued)

FOREIGN PATENT DOCUMENTS

CN     1204185 A     1/1999
CN     1324148 A     11/2001
(Continued)

OTHER PUBLICATIONS

International Search Report and Written Opinion dated Sep. 2, 2021 in International Application PCT/CN2021/101449.
(Continued)

*Primary Examiner* — Phuong Phu
(74) *Attorney, Agent, or Firm* — Venable LLP

(57) ABSTRACT

The present disclosure relates to a method for up-converting a clock signal, a clock circuit and a digital processing device. More specifically, provided is a method for up-converting a clock signal, comprising: employing a first clock sub-circuit to provide a clock signal having a first frequency to a chip; receiving an instruction to up-convert the clock signal having the first frequency to a clock signal having a second frequency; in response to receiving the instruction, causing a second clock sub-circuit to output the clock signal having the second frequency; and after the second clock sub-circuit outputs the clock signal having the second frequency,
(Continued)

employing the second clock sub-circuit to provide the clock signal having the second frequency to the chip in place of the first clock sub-circuit.

9 Claims, 4 Drawing Sheets

(51) Int. Cl.
*H03L 7/089* (2006.01)
*H03L 7/093* (2006.01)

(58) Field of Classification Search
USPC .................................. 375/257, 254, 371, 373
See application file for complete search history.

(56) References Cited

U.S. PATENT DOCUMENTS

| | | | |
|---|---|---|---|
| 6,223,297 B1* | 4/2001 | Inoue | ........................ G06F 1/08 713/322 |
| 7,502,267 B2 | 3/2009 | Lin et al. | |
| 2007/0198242 A1 | 8/2007 | Brunot | |
| 2008/0219331 A1 | 9/2008 | Liang et al. | |
| 2009/0193172 A1 | 7/2009 | Brunot | |
| 2010/0325451 A1 | 12/2010 | Chang | |
| 2012/0166832 A1 | 6/2012 | Henry et al. | |
| 2013/0147526 A1 | 6/2013 | Kim et al. | |
| 2014/0026146 A1 | 1/2014 | Jahagirdar et al. | |
| 2016/0239074 A1 | 8/2016 | Lee et al. | |

FOREIGN PATENT DOCUMENTS

| | | |
|---|---|---|
| CN | 1475887 A | 2/2004 |
| CN | 101067758 A | 11/2007 |
| CN | 101072029 A | 11/2007 |
| CN | 101854171 A | 10/2010 |
| CN | 101931384 A | 12/2010 |
| CN | 102013920 A | 4/2011 |
| CN | 102118160 A | 7/2011 |
| CN | 102445916 A | 5/2012 |
| CN | 102801304 A | 11/2012 |
| CN | 102868398 A | 1/2013 |
| CN | 102904562 A | 1/2013 |
| CN | 102981803 A | 3/2013 |
| CN | 103780097 A | 5/2014 |
| CN | 103888136 A | 6/2014 |
| CN | 104076863 A | 10/2014 |
| CN | 105425898 A | 3/2016 |
| CN | 106066817 A | 11/2016 |
| CN | 109194308 A | 9/2019 |
| CN | 110221650 A | 9/2019 |
| CN | 111541451 A | 8/2020 |
| TW | 201331748 A | 8/2013 |
| TW | 201342209 A | 10/2013 |
| TW | 201428482 A | 7/2014 |
| TW | 201643714 A | 12/2016 |

OTHER PUBLICATIONS

Office Action dated Dec. 10, 2020 in Chinese Patent Application No. 202010582032.2.
Office Action dated Apr. 20, 2021 in Chinese Patent Application No. 202010582032.2.
Office Action dated Aug. 23, 2021 in Chinese Patent Application No. 202010582032.2.
Notice of Allowance dated Sep. 28, 2021 in Chinese Patent Application No. 202010582032.2.
Zhang et al., Circuits Design of High Stability Stepping Motor Drive, Computer Engineering, Feb. 2007, pp. 247-249, vol. 33 No. 4, Shanghai Institute of Technical Physics, Chinese Academy of Sciences, Shanghai 200083.

* cited by examiner

METHOD FOR UP-CONVERTING CLOCK SIGNAL, CLOCK CIRCUIT AND DIGITAL PROCESSING DEVICE

CROSS-REFERENCE TO RELATED APPLICATIONS

The present application is a national stage entry of International application No. PCT/CN2021/101449, filed on Jun. 22, 2021, which claims priority to Chinese Patent Application No. 202010582032.2, filed on Jun. 23, 2020, the disclosures of which are hereby incorporated by reference in their entireties.

TECHNICAL FIELD

The present disclosure relates to a method for up-converting a clock signal, a clock circuit and a digital processing device.

BACKGROUND

Bitcoin is a virtual encrypted digital currency in a form of P2P (Peer-to-Peer), and its concept was first proposed by Satoshi Nakamoto on Nov. 1, 2008 and formally came into being on Jan. 3, 2009. Bitcoin is unique in that it is not issued by a specific monetary institution, but is generated through a large number of operations according to a specific algorithm. As for a Bitcoin transaction, a distributed database composed of numerous nodes throughout a P2P network is used to confirm and record all transactions, and cryptography design is used to ensure their security.

Bitcoin mining is typically performed using a digital processing device (e.g., a Bitcoin mining machine, or a mining machine for short). For the digital processing device such as the mining machine, when the digital processing device is started, a chip (specifically, its clock signal) in the digital processing device is typically subject to a gradual incremental up-inversion at a small frequency interval, such that the temperature in the digital processing device gradually and slowly rises, to avoid chip damage caused by rapid heat generation and expansion of the digital processing device in a humid environment, and meanwhile enable a more stable operation of the digital processing device.

A clock of the chip within the digital processing device is typically provided by a clock sub-circuit (e.g., in a form of a phase-locked loop (PLL) or frequency-locked loop (FLL)), etc. The clock sub-circuit is typically composed of an oscillator and a frequency divider which are cascaded, wherein the clock generated by the oscillator is divided by the frequency divider and then used by the chip. That is, in order to obtain a desired frequency, it is needed to configure the clock sub-circuit (e.g., its oscillator and frequency divider) to provide a clock signal of the desired frequency.

In the process of the gradual up-conversion of the digital processing device, the clock sub-circuit (e.g., its oscillator and frequency divider) needs to be constantly configured to provide a clock signal of a desired incremented frequency. However, when the frequency is incremented, while the clock sub-circuit (e.g., its oscillator and frequency divider) is configured, an abnormal intermediate frequency would, before a desired stable clock signal is output, appear due to different stability times of sub-circuits included in the clock sub-circuit and so on, thereby causing a sudden change in the frequency. Such an abnormal sudden change in the clock frequency will make the digital processing device become unstable and affect or even destroy circuits of the chip in the digital processing device.

Therefore, there is a need for an improved method for up-converting the clock signal and a clock circuit.

SUMMARY

According to a first aspect of the present disclosure, there is provided a method for up-converting a clock signal, comprising: employing a first clock sub-circuit to provide a clock signal having a first frequency to a chip; receiving an instruction to up-convert the clock signal having the first frequency to a clock signal having a second frequency; in response to receiving the instruction, causing a second clock sub-circuit to output the clock signal having the second frequency; and after the second clock sub-circuit outputs the clock signal having the second frequency, employing the second clock sub-circuit to provide the clock signal having the second frequency to the chip in place of the first clock sub-circuit.

According to a second aspect of the present disclosure, there is provided a method for up-converting a clock signal, comprising: employing a first clock sub-circuit to provide a clock signal having a first frequency to a chip; receiving an instruction to up-convert the clock signal having the first frequency to a clock signal having a second frequency; in response to receiving the instruction, causing the second clock sub-circuit to output the clock signal having the first frequency and provide the clock signal having the first frequency to the chip in place of the first clock sub-circuit; causing the first clock sub-circuit to output the clock signal having the second frequency; and after the first clock sub-circuit outputs the clock signal having the second frequency, employing the first clock sub-circuit to provide the clock signal having the second frequency to the chip.

According to a third aspect of the present disclosure, there is provided a clock circuit comprising: a first clock sub-circuit and a second clock sub-circuit configured to output a clock signal of a specified frequency; a switching sub-circuit configured to perform switching between the first clock sub-circuit and the second clock sub-circuit; and a configuration sub-circuit configured to: employ the first clock sub-circuit to provide a clock signal having a first frequency to a chip; receive an instruction to up-convert the clock signal having the first frequency to a clock signal having a second frequency; in response to receiving the instruction, cause the second clock sub-circuit to output the clock signal having the second frequency; and after the second clock sub-circuit outputs the clock signal having the second frequency, employ the second clock sub-circuit to provide the clock signal having the second frequency to the chip in place of the first clock sub-circuit.

According to a fourth aspect of the present disclosure, there is provided a clock circuit comprising: a first clock sub-circuit and a second clock sub-circuit configured to output a clock signal of a specified frequency; a switching sub-circuit configured to perform switching between the first clock sub-circuit and the second clock sub-circuit; and a configuration sub-circuit configured to: employ the first clock sub-circuit to provide a clock signal having a first frequency to a chip; receive an instruction to up-convert the clock signal having the first frequency to a clock signal having a second frequency; in response to receiving the instruction, employ the second clock sub-circuit to provide the clock signal having the first frequency to the chip in place of the first clock sub-circuit; cause the first clock sub-circuit to output the clock signal having the second frequency; and after the first clock sub-circuit outputs the clock signal having the second frequency, employ the first clock sub-circuit to provide the clock signal having the second frequency to the chip.

According to a fifth aspect of the present disclosure, there is provided a digital processing device comprising the clock circuit as described above.

Other features of the present disclosure and advantages thereof will become apparent from the following detailed description of exemplary embodiments thereof, which proceeds with reference to the accompanying drawings.

BRIEF DESCRIPTION OF THE DRAWINGS

The accompanying drawings, which constitute a part of this specification, illustrate embodiments of the present disclosure and together with the specification, serve to explain principles of the present disclosure.

The present disclosure can be more clearly understood from the following detailed description taken in conjunction with the accompanying drawings, in which.

Figure 1:
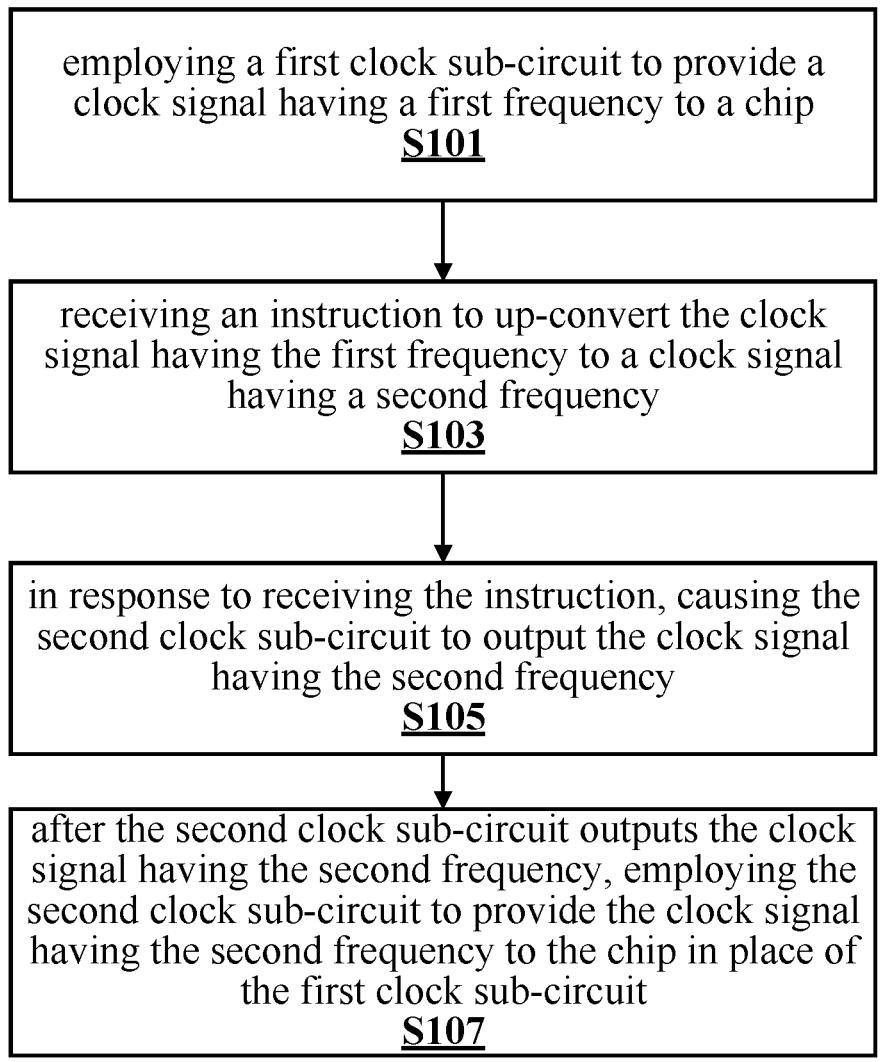
FIG. 1 illustrates a flow diagram of a method for up-converting a clock signal according to at least one embodiment.

Note that in implementations described below, a same reference numeral is sometimes shared among different drawings to denote a same portion or a portion having a same function, and a repetitive description thereof will be omitted. In this specification, similar reference numerals and letters are used to denote similar items, and therefore, once a certain item is defined in one drawing, its further discussion is not required in subsequent drawings.

For ease of understanding, positions, dimensions, ranges, and the like of structures shown in the drawings sometimes do not necessarily represent their actual positions, dimensions, ranges, and the like. Therefore, the disclosed disclosure is not limited to the positions, dimensions, ranges, and the like disclosed in the drawings. In addition, the drawings are not necessarily drawn to scale, and some features may be enlarged to show details of specific components.

DETAILED DESCRIPTION

Various exemplary embodiments of the present disclosure will now be described in detail with reference to the accompanying drawings. It should be noted that: relative arrangements of components and steps, numerical expressions and numerical values set forth in these embodiments do not limit the scope of the present disclosure unless otherwise specified.

The following description of at least one exemplary embodiment is merely illustrative in nature and is in no way intended to limit the present disclosure and its application or uses. That is, circuits and methods for implementing a hash algorithm herein are exemplarily shown to illustrate different embodiments of the circuits or methods in this disclosure and are not intended to be limited thereto. Those skilled in the art will appreciate that they are merely illustrative of exemplary ways in which the present disclosure can be implemented, rather than exhaustive ways.

Techniques, methods, and devices known to one of ordinary skill in the related art may not be discussed in detail but are intended to be part of the granted specification where appropriate.

FIG. 1 illustrates a flow diagram 100 of a method for up-converting a clock signal according to at least one embodiment.

As shown in FIG. 1, at step S101, a first clock sub-circuit is employed to provide a clock signal having a first frequency to a chip. The chip can be, for example, a chip of a digital processing device such as a mining machine. The chip can include, for example, any circuit that receives a clock signal for operation.

In one example, the first clock sub-circuit comprises a first oscillator and a first frequency divider that divides an output of the first oscillator. The first oscillator and the first frequency divider of the first clock sub-circuit can be formed, for example, in a form of a phase-locked loop (PLL) or a frequency-locked loop (FLL). The first clock sub-circuit can be configured, for example, to output a clock signal having a first frequency in the case where the first oscillator operates in its optimal frequency range. The optimal frequency range refers to a frequency range in which the performance of the oscillator is good. The optimal frequency range is typically specific to the oscillator.

In one specific example, the optimal frequency range of the first oscillator is, for example, between 1.2 GHz and 2.4 GHz, while the first frequency is, for example, 300 MHz. To achieve the first frequency of 300 MHz, the first oscillator and the first frequency divider of the first clock sub-circuit can be configured as follows: the first oscillator operating at a frequency of 2400 MHz, the first frequency divider being configured as 8-frequency division, thereby obtaining the first frequency of 2400 MHz/8=300 MHz.

At step S103, an instruction to up-convert the clock signal having the first frequency to a clock signal having a second frequency is received.

In one specific example, the first frequency can be, for example, 300 MHz as described above, and the second frequency can be, for example, 301 MHz. In this specific example, an up-conversion step is 1 MHz. However, a difference between the second frequency and the first frequency (i.e., the up-conversion step) can be set as desired by those skilled in the art, and the present disclosure is not limited thereto.

At step S105, in response to receiving the instruction, the second clock sub-circuit is caused to output the clock signal having the second frequency. This step comprises, for example, configuring the second clock sub-circuit (e.g., its components), such that the second clock sub-circuit outputs the clock signal having the second frequency.

In one example, the structure and/or performance of the second clock sub-circuit and/or its components are identical or similar to the first clock sub-circuit. However, one skilled in the art will appreciate that the second clock sub-circuit can be different from the first clock sub-circuit, and the present disclosure is not limited thereto. For ease of description, it is assumed hereinafter that the second clock sub-circuit is identical or similar to the first clock sub-circuit.

In one example, the second clock sub-circuit comprises a second oscillator and a second frequency divider that divides an output of the second oscillator. The second oscillator and the second frequency divider of the second clock sub-circuit can be formed, for example, in a form of a phase-locked loop (PLL) or a frequency-locked loop (FLL). The second clock sub-circuit is configured, for example, to provide the clock signal having the second frequency in the case where the second oscillator operates in its optimal frequency range. The optimal frequency range refers to a frequency range in which the performance of the oscillator is good. The optimal frequency range is typically specific to the oscillator.

According to one specific example of the present disclosure, it is assumed that, similar to the first oscillator of the first clock sub-circuit, the optimal frequency range of the second oscillator of the second clock sub-circuit is, for example, between 1.2 GHz and 2.4 GHz. When the frequency of the clock signal is up-converted from the first frequency of 300 MHz to the second frequency of 301 MHz, in order to enable the second clock sub-circuit to provide the clock signal having the second frequency in the case where the second oscillator operates in the optimal frequency range, the second clock sub-circuit can be configured as follows: the second oscillator is configured to operate at 1204 MHz, and the second frequency divider being configured as 4-frequency division, thereby obtaining the second frequency of 1204/4=301 MHz.

At step S107, after the second clock sub-circuit outputs the clock signal having the second frequency, the second clock sub-circuit is employed to provide the clock signal having the second frequency to the chip in place of the first clock sub-circuit. For example, after a clock signal of a stable frequency (i.e. the clock signal stabilized at the second frequency) is provided by the second clock sub-circuit, the second clock sub-circuit is employed to provide the clock signal having the second frequency to the chip in place of the first clock sub-circuit.

If the first clock sub-circuit is still employed to provide the clock signal having the second frequency to the chip in the process of the up-conversion, an intermediate frequency other than the target frequency would appear in the process of the up-conversion, due to different response times (or stability times) of sub-circuits (e.g., the first oscillator, the first frequency divider, etc.) in the first clock sub-circuit from the reception of the instruction to configure the first clock sub-circuit (e.g., the up-conversion instruction) to the actual implementation of the instruction (i.e., obtaining the stable target frequency). Such an intermediate frequency (or abnormal sudden change in the clock) would affect or even destroy the performance of the circuits in the chip.

According to at least one embodiment of the present disclosure, however, after receiving the instruction to up-convert the clock signal from the first frequency to the second frequency, instead of configuring the frequency of the first clock sub-circuit currently being used to provide the clock signal having the first frequency as the second frequency, the frequency of the second clock sub-circuit not currently used to provide the clock signal having the first frequency to the chip is configured as the second frequency (e.g., the up-conversion operation), and after the second clock sub-circuit outputs the clock signal having the second frequency (e.g., after the up-conversion is completed and the stable clock signal is output), the second clock sub-circuit is employed to provide the clock signal having the second frequency to the chip in place of the first clock sub-circuit. Thus, in terms of the chip using the clock signal, in the process of the up-conversion, the jump from the clock signal having the first frequency to the clock signal of the second clock frequency is achieved without the intermediate frequency, thereby avoiding affecting or even destroying the performance of the circuits in the chip.

According to a specific example, if the first clock sub-circuit is still employed to provide the clock signal having the second frequency to the chip in the process of the up-conversion from 300 MHz to 301 MHz, the following situation would appear: the first oscillator of the first clock sub-circuit (typically implemented by an analog circuit) being adjusted relatively slowly from 2400 MHz to 1204 MHz over a period of time, wherein the adjustment range is large and the adjustment time is long, and the first frequency divider (typically implemented by a digital circuit) being immediately changed from 8-frequency division to 4-frequency division, thus the resulting frequency being adjusted relatively slowly from 600 MHz (2400 MHz/4) to 301 MHz (1204 MHz/4). In terms of the whole process of the up-conversion, it is desired to obtain a smooth transition from 300 MHz to 301 MHz, whereas what is actually obtained is a frequency jump from 300 MHz to 600 MHz and then to 301 MHz. Such an intermediate frequency (or abnormal sudden change in the clock) can affect or even destroy the performance of circuits in the chip.

According to at least one embodiment of the present disclosure, after receiving the up-conversion instruction to configure the clock signal from 300 MHz to 301 MHz, instead of configuring the frequency of the first clock sub-circuit currently being used to provide the clock signal having the first frequency to the chip from 300 MHz to 301 MHz, the frequency of the second clock sub-circuit not currently used to provide the clock signal having the first frequency to the chip is configured as 301 MHz, and after the second clock sub-circuit outputs the clock signal having the second frequency (i.e., 301 MHz), the second clock sub-circuit is employed to provide the clock signal having the second frequency (i.e., 301 MHz) to the chip in place of the first clock sub-circuit. Therefore, in terms of the chip using the clock signal, in the process of the up-conversion, the frequency of the clock signal jumps from 300 MHz to 301 MHz without the intermediate frequency, thereby reducing the possibility of making the chip performance unstable or damaging the chip.

It can be determined in various ways that the second clock sub-circuit outputs the clock signal having the second frequency, for example, by detecting a frequency-locked status register of the second clock sub-circuit, and after detecting that the frequency is locked, the second clock sub-circuit is employed to provide the clock signal having the second frequency to the chip in place of the first clock sub-circuit, i.e., performing switching from the first clock sub-circuit to the second clock sub-circuit. Alternatively, a timer can be set and after expiration of the timer, the second clock sub-circuit is employed to provide the clock signal having the second frequency to the chip in place of the first clock sub-circuit, i.e. performing switching from the first clock sub-circuit to the second clock sub-circuit. Alternatively, the clock signal output by the second clock sub-circuit can be detected, and in the case where it is determined that the clock signal output by the second clock sub-circuit is the clock signal having the second frequency, the second clock sub-circuit is employed to provide the clock signal having the second frequency in place of the first clock sub-circuit.

In one example, the method 100 can further comprise: after employing the second clock sub-circuit to provide the clock signal having the second frequency to the chip in place of the first clock sub-circuit, causing the first clock sub-circuit to output the clock signal having the second frequency; and after the first clock sub-circuit outputs the clock signal having the second frequency, employing the first clock sub-circuit to provide the clock signal having the second frequency to the chip in place of the second clock sub-circuit.

For example, in the case where the performance of the first clock sub-circuit is better than that of the second clock sub-circuit, it is desired that the first clock sub-circuit is still employed to provide the clock signal after the up-conversion ends. In this case, after the second clock sub-circuit is employed to provide the clock signal having the second frequency (e.g., the clock signal of 301 MHz) to the chip, the first clock sub-circuit can be configured to provide the clock signal having the second frequency, and after the first clock sub-circuit outputs the clock signal having the second frequency, the clock of the chip is switched back to the first clock sub-circuit from the second clock sub-circuit. For example, after the first clock sub-circuit outputs a clock signal of a stable frequency (i.e., the clock signal stabilized at the second frequency), the clock of the chip is switched back to the first clock sub-circuit from the second clock sub-circuit.

The performance index of the clock sub-circuit mainly refers to the accuracy of the clock, including a minimum jitter of the clock frequency and the clock's half cycle reaching a duty cycle of about 50%, that is, one clock cycle is divided into high and low pulses, each of which has the same width and accounts for a half thereof. The performance index of the clock sub-circuit can also include power consumption. In addition, those skilled in the art will appreciate that two clock sub-circuits, even if designed identically, may have differences in performance in a same chip, i.e., one of them is superior to the other in performance, since the employed devices are not the same one (i.e., due to differences between performances of the devices on the same chip).

Similar to the determining that the second clock sub-circuit outputs the clock signal having the second frequency, described above, it can be determined in various ways that the first clock sub-circuit outputs the clock signal having the second frequency.

In the process of the actual up-conversion operation, a gradual up-conversion is required. For example, after the up-conversion from 300 MH to 301 MHz, it is necessary to continue the up-conversion operation.

In one example, the method 100 can further comprise: receiving a second instruction to up-convert the clock signal having the second frequency to a clock signal having a third frequency; in response to receiving the second instruction, causing a clock sub-circuit other than a current clock sub-circuit (one providing the second frequency), such as the first clock sub-circuit or the second clock sub-circuit, to output the clock signal having the third frequency; and after the sub-circuit outputs the clock signal having the third frequency, employing the clock sub-circuit to provide the clock signal having the third frequency to the chip in place of the current clock sub-circuit. For example, when the second frequency is provided by the second clock sub-circuit, after the first clock sub-circuit outputs a clock signal of a stable frequency (i.e., the clock signal stabilized at a third frequency), the first clock sub-circuit is employed to provide the clock signal having the third frequency to the chip in place of the second clock sub-circuit; and when the second frequency is provided by the first clock sub-circuit, after the second clock sub-circuit outputs a clock signal of a stable third frequency, the second clock sub-circuit is employed to provide the clock signal having the third frequency to the chip in place of the first clock sub-circuit. The subsequent process of the up-conversion follows this way and will not be repeated.

Similar to the above description, it is determined in various ways that the first clock sub-circuit outputs the clock signal having the third frequency (e.g., the up-conversion operation is completed).

By using the method of up-converting the clock signal according to the embodiments of the present disclosure, the first clock sub-circuit and the second clock sub-circuit are backed up to each other in the process of the up-conversion, avoiding the occurrence of the intermediate frequency, thereby reducing the possibility of making the chip performance unstable or even damaging the chip.

Figure 2:
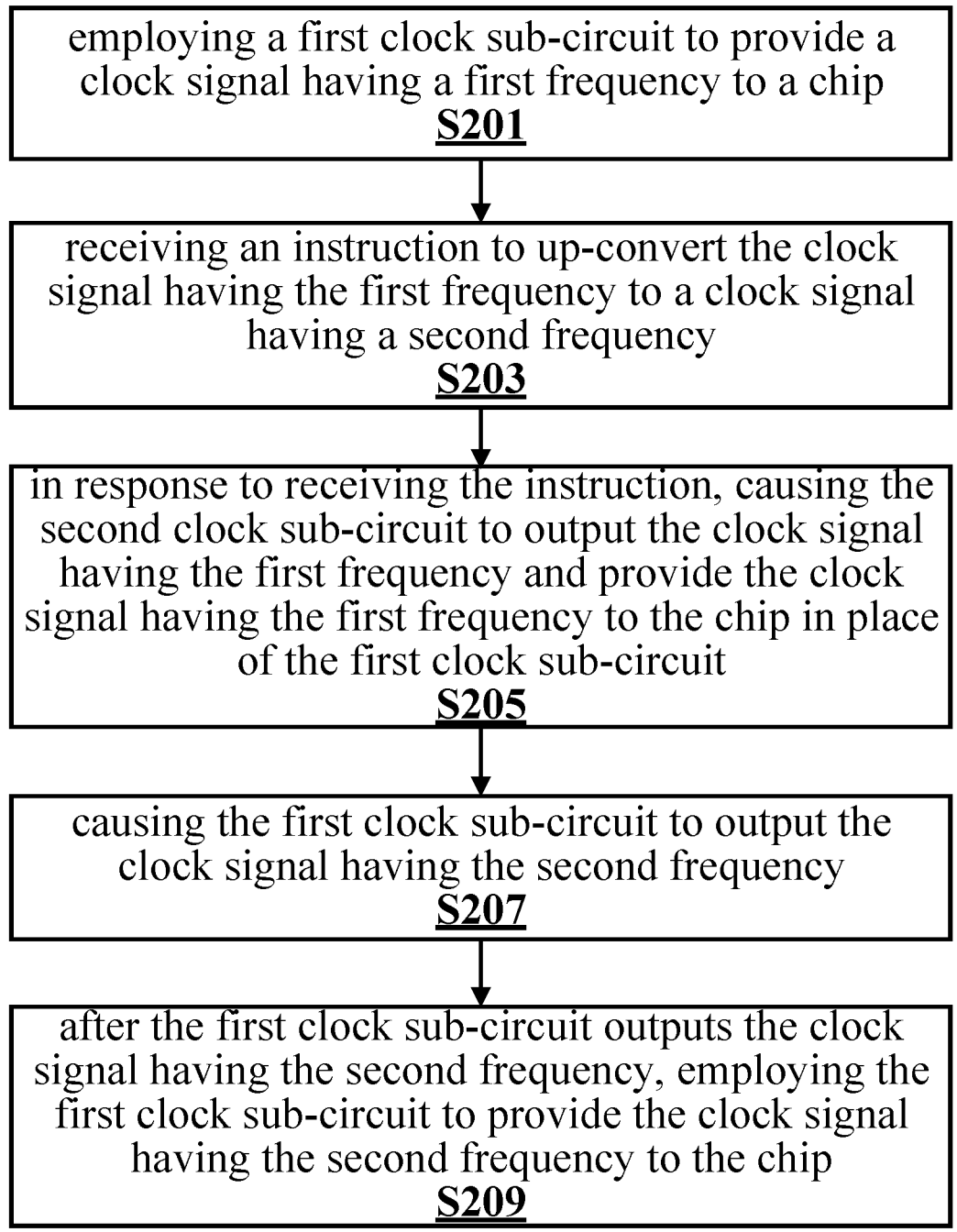
FIG. 2 illustrates a flow diagram of a method for up-converting a clock signal according to at least one other embodiment.

FIG. 2 is a flow diagram illustrating a method 200 for up-converting a clock signal according to at least one other embodiment.

Similar to the step S101 of the method 100, at step S201, a first clock sub-circuit is employed to provide a clock signal having a first frequency to the chip.

Similar to the step S103 of the method 100, at step S203, an instruction to up-convert the clock signal having the first frequency to a clock signal having a second frequency is received.

Since the steps S201 and S203 of the method 200 are similar to the steps S101 and S103 of the method 100, the above description of the steps S101 and S103 applies equally to the steps S201 and S203, and thus steps S201 and S203 will not be described in detail herein.

At step S205, in response to receiving the instruction, the second clock sub-circuit is caused to output the clock signal having the first frequency and provide the clock signal having the first frequency to the chip in place of the first clock sub-circuit. For example, if the clock signal output by the second clock sub-circuit is not the clock signal having the first frequency when receiving the instruction, the second clock sub-circuit (e.g., its components) is configured to cause the second clock sub-circuit to output the clock signal having the first frequency.

At step S207, the first clock sub-circuit is caused to output the clock signal having the second frequency. This step comprises, for example, configuring the first clock sub-circuit (e.g., its components) to cause the first clock sub-circuit to output the clock signal having the second frequency.

At step S209, after the first clock sub-circuit outputs the clock signal having the second frequency, the first clock sub-circuit is employed to provide the clock signal having the second frequency to the chip. For example, after the first clock sub-circuit outputs a clock signal of a stable frequency (i.e., the clock signal stabilized at the second frequency), the first clock sub-circuit is employed to provide the clock signal having the second frequency to the chip.

Similar to the above description, it can determined in various ways that the first clock sub-circuit outputs the clock signal having the second frequency (e.g., the up-conversion operation is completed).

According to this embodiment of the present disclosure, in the process of the up-conversion, first, the sub-circuit by which the clock signal having the first frequency is provided to the chip is switched from the first clock sub-circuit to the second clock sub-circuit, then the first clock sub-circuit is configured (such as the up-conversion operation), and after the first clock sub-circuit outputs the clock signal having the second frequency (i.e., after the up-conversion operation is completed and the stable clock signal is output), it is switched back to the first clock sub-circuit, so that the first clock sub-circuit is employed to provide the clock signal having the second frequency to the chip. Thus, in terms of the chip using the clock signal, in the process of the up-conversion, there occurs a jump from the clock signal having the first frequency to the clock signal having the second frequency without any intermediate frequency, thereby reducing the possibility of making the chip performance unstable or even damaging the chip.

In addition, this embodiment of the present disclosure is particularly useful in the case where the performance of the first clock sub-circuit is superior to that of the second clock sub-circuit, because the second clock sub-circuit is only employed as a temporary clock sub-circuit during the up-conversion, while the first clock sub-circuit having better performance is mainly employed as the clock sub-circuit, thereby causing less effects on the chip performance.

Figure 3:
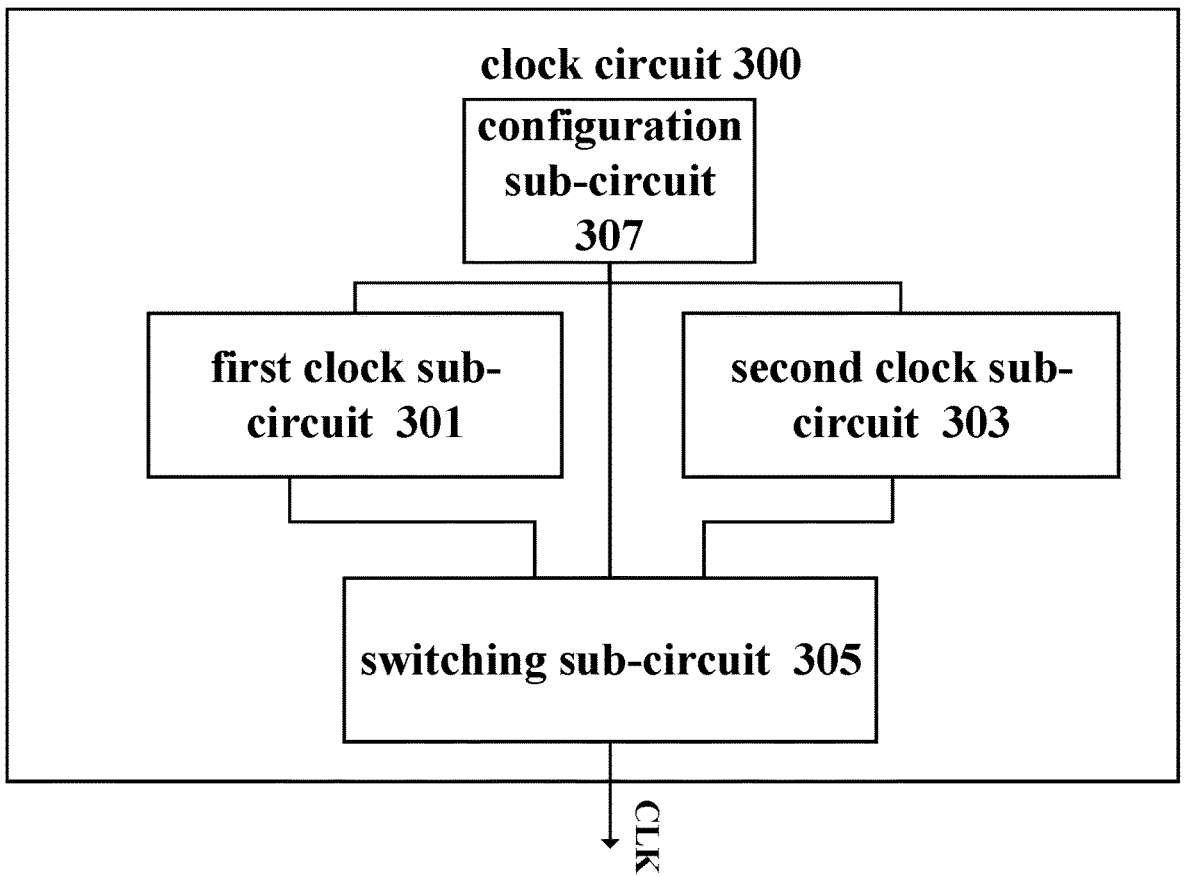
FIG. 3 illustrates a block diagram of a clock circuit according to at least one embodiment of the present disclosure.

FIG. 3 illustrates a block diagram of a clock circuit 300 according to at least one embodiment of the present disclosure. The clock circuit 300 can be configured to up-convert the clock signal of the chip.

As shown in the figure, the clock circuit 300 comprises: a first clock sub-circuit 301, a second clock sub-circuit 303, a switching sub-circuit 305, and a configuration sub-circuit 307.

The above description of the first clock sub-circuit and the second clock sub-circuit when the methods 100 and 200 are described applies equally to the first clock sub-circuit 301 and the second clock sub-circuit 303 in the clock circuit 300, and therefore, the first clock sub-circuit 301 and the second clock sub-circuit 303 will not be described again herein.

In one example, the first clock sub-circuit 301 and the second clock sub-circuit 303 are configured to output a clock signal of a specified frequency.

In one example, the first clock sub-circuit 301 comprises a first oscillator and a first frequency divider that divides an output of the first oscillator. The first clock sub-circuit 301 is configured to provide the clock signal of the specified frequency in the case where the first oscillator operates in its optimal frequency range. The first clock sub-circuit 301 can be, for example, a specific clock sub-circuit in the chip or any idle clock sub-circuit in the chip.

In one example, the second clock sub-circuit 303 comprises a second oscillator and a second frequency divider that divides an output of the second oscillator. The second clock sub-circuit 303 is configured to provide the clock signal of the specified frequency in the case where the second oscillator operates in its optimal frequency range. The second clock sub-circuit 303 can be, for example, another specific clock sub-circuit in the chip or another idle clock sub-circuit in the chip.

In one example, the switching sub-circuit 305 is configured to perform switching between the first clock sub-circuit 301 and the second clock sub-circuit 303.

In one example, the configuration sub-circuit 307 is configured to: employ the first clock sub-circuit to provide a clock signal having a first frequency to the chip; receive an instruction to up-convert the clock signal having the first frequency to a clock signal having a second frequency; in response to receiving the instruction, cause the second clock sub-circuit to output the clock signal having the second frequency; and employ the second clock sub-circuit to provide the clock signal having the second frequency to the chip in place of the first clock sub-circuit.

For example, cooperation between the switching sub-circuit 305 and the configuration sub-circuit 307 is performed to implement actual switching between the first clock sub-circuit 301 and the second clock sub-circuit 303, i.e. the first clock sub-circuit 301 or the second clock sub-circuit 303 is actually employed to provide the clock signal of the specified frequency to the chip. For example, in response to the configuration sub-circuit 307 employing the first clock sub-circuit 301 to provide the clock signal having the first frequency to the chip (e.g., in response to a signal from the configuration sub-circuit 307), the switching sub-circuit 305 selects the first clock sub-circuit 301 to provide the clock signal having the first frequency to the chip, and in response to the configuration sub-circuit 307 employing the second clock sub-circuit 303 to provide the clock signal having the second frequency to the chip in place of the first clock sub-circuit 301 (e.g., in response to a signal from the configuration sub-circuit 307), the switching sub-circuit 305 selects the second clock sub-circuit 303 to provide the clock signal having the second frequency to the chip, and vice versa. In this way, the actual switching between the first clock sub-circuit 301 and the second clock sub-circuit 303 is achieved.

In one example, the configuration sub-circuit 307 is further configured to: after employing the second clock sub-circuit to provide the clock signal having the second frequency to the chip in place of the first clock sub-circuit, cause the first clock sub-circuit to output the clock signal having the second frequency; and after the first clock sub-circuit outputs the clock signal having the second frequency, employ the first clock sub-circuit to provide the clock signal having the second frequency to the chip in place of the second clock sub-circuit.

Similar to the above description, the actual switching between the first clock sub-circuit 301 and the second clock sub-circuit 303 can be achieved by the cooperation between the switching sub-circuit 305 and the configuration sub-circuit 307, which will not be repeated herein.

In one example, the configuration sub-circuit 307 is further configured to: in response to receiving a second instruction to up-convert the clock signal having the second frequency to a clock signal having a third frequency, cause a clock sub-circuit other than a current clock sub-circuit(one providing the second frequency), such as the first clock sub-circuit or the second clock sub-circuit, to output the clock signal having the third frequency; and after the clock sub-circuit outputs the clock signal having the third frequency, employ the clock sub-circuit to provide the clock signal having the third frequency to the chip in place of the current clock sub-circuit.

Similar to the above description, the actual switching between the first clock sub-circuit 301 and the second clock sub-circuit 303 can be achieved by the cooperation between the switching sub-circuit 305 and the configuration sub-circuit 307, which will not be repeated here.

In the above description, the configuration sub-circuit 307 is described as implementing the configuration (e.g., the up-conversion) of the first and second clock sub-circuits 301 and 303 and the control of the switching sub-circuit 305 (e.g., by sending a signal to the switching sub-circuit 305), while the switching sub-circuit 305 is described as performing the actual switching between the first and second clock sub-circuits 301 and 303, and the configuration sub-circuit 307 and the switching sub-circuit 305 are described as separate sub-circuits. However, it can be understood by those skilled in the art that the configuration sub-circuit 307 and the switching sub-circuit 305 can be implemented by a single sub-circuit and/or divided into more sub-circuits as long as it or they can implement the above-mentioned functions of the present disclosure, and the present disclosure is not limited thereto.

According to another embodiment of the present disclosure, similar to FIG. 3, the clock circuit according to this embodiment comprises a first clock sub-circuit 301, a second clock sub-circuit 303, a switching sub-circuit 305, and a configuration sub-circuit 307 (shown in FIG. 3). However, in this embodiment, the operation of the configuration sub-circuit 307 is different from that of the configuration sub-circuit described above.

In one example, the configuration sub-circuit 307 is configured to: employ the first clock sub-circuit to provide a clock signal having a first frequency to a chip; receive an instruction to up-convert the clock signal having the first frequency to a clock signal having a second frequency; in response to receiving the instruction, employ the second clock sub-circuit to provide the clock signal having the first frequency to the chip in place of the first clock sub-circuit; cause the first clock sub-circuit to output the clock signal having the second frequency; and employ the first clock sub-circuit to provide the clock signal having the second frequency to the chip.

In one example, the first clock sub-circuit 301 comprises a first oscillator and a first frequency divider that divides an output of the first oscillator. The first clock sub-circuit 301 is configured to provide a clock signal of a specified frequency in the case where the first oscillator operates in its optimal frequency range. The first clock sub-circuit 301 can be, for example, a specific clock sub-circuit in the chip or any idle clock sub-circuit in the chip.

In one example, the second clock sub-circuit 303 comprises a second oscillator and a second frequency divider that divides an output of the second oscillator. The second clock sub-circuit 303 is configured to provide a clock signal of a specified frequency in the case where the second oscillator operates in its optimal frequency range. The second clock sub-circuit 303 can be, for example, another specific clock sub-circuit in the chip or another idle clock sub-circuit in the chip.

Figure 4:
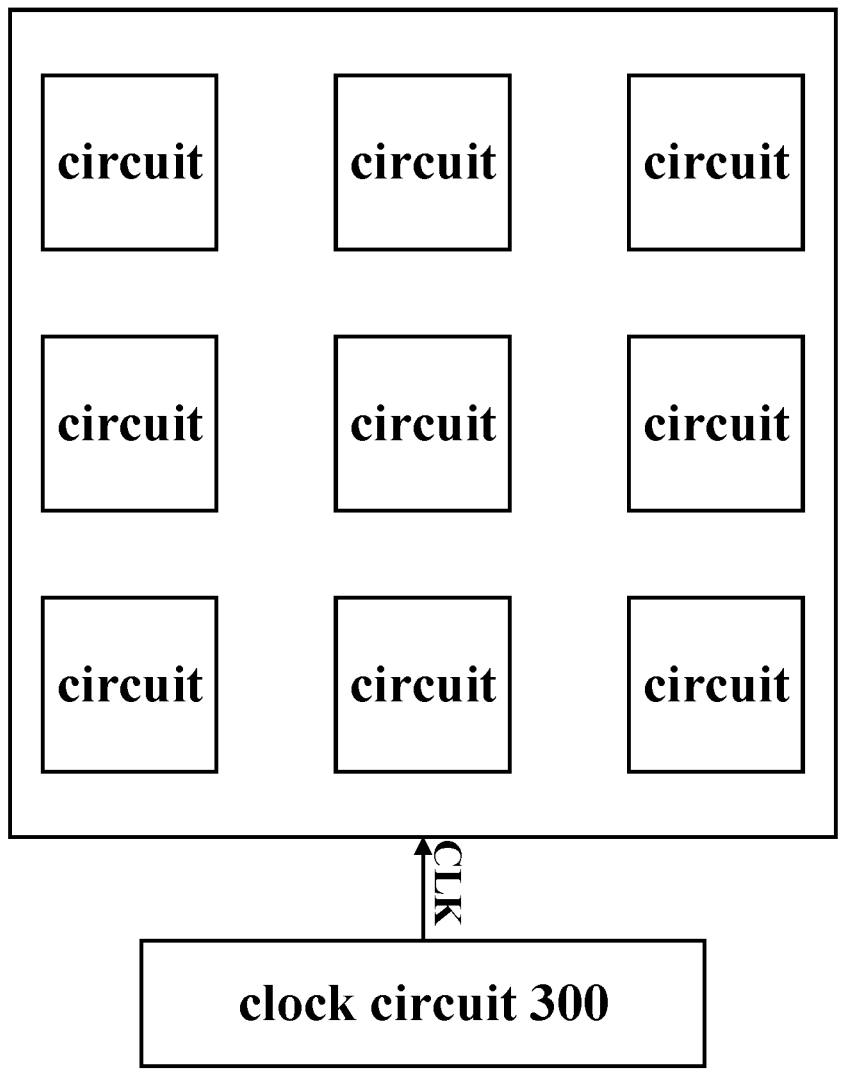
FIG. 4 is a schematic diagram of a digital processing device according to at least one embodiment of the present disclosure.

FIG. 4 is a schematic diagram of a digital processing device 400 according to at least one embodiment of the present disclosure. The device 400 can be, for example, a mining machine for performing Bitcoin mining.

As shown, the device 400 comprises the clock circuit 300 described above and a plurality of circuits that receive a clock signal CLK from the clock circuit 300 for operation.

As will be understood by those skilled in the art, the sub-circuits (e.g., the clock sub-circuit and the switching sub-circuit and the configuration sub-circuit) and circuits (e.g., the clock circuit 300 and the plurality of circuits shown in FIG. 4) described herein can be implemented, for example, by application specific integrated circuits or FPGAs, etc., and the present disclosure is not limited thereto.

In all examples shown and discussed herein, any specific value should be construed as exemplary only and not as limiting. Thus, other examples of the exemplary embodiments can have different values.

As used herein, the term "exemplary" means "to be used as an example, instance, or illustration", and not as a "model" that is to be reproduced exactly. Any implementation exemplarily described herein is not necessarily to be construed as more preferable or advantageous than another implementation. Furthermore, the present disclosure is not limited to any expressed or implied theory presented in the foregoing technical field, background, summary or detailed description.

As used herein, the term "substantially" means encompassing any minor variations caused by defects in design or fabrication, tolerances of devices or elements, environmental effects and/or other factors. The term "substantially" also allows for differences from a perfect or ideal situation, which are caused by parasitics, noise, and other practical considerations that may exist in a practical implementation.

The above description can indicate elements or nodes or features being "connected" or "coupled" together. As used herein, unless otherwise specified, "connected" means that one element/node/feature is directly connected to (or directly communicates with) another element/node/feature, electrically, mechanically, logically, or otherwise. Similarly, unless otherwise specified, "coupled" means that one element/node/feature can be directly or indirectly connected to another element/node/feature mechanically, electrically, logically or otherwise to allow interaction, even though the two features may not be directly connected. That is, "coupled" is intended to encompass both direct and indirect connections of the elements or other features, including connections using one or more intermediate elements.

It should be further understood that when the terms "comprise/include", when used herein, specify the presence of stated features, whole, steps, operations, units, and/or components, but do not preclude the presence or addition of one or more other features, whole, steps, operations, units, components, and/or their combinations.

Those skilled in the art should appreciate that boundaries between the above operations are merely illustrative. Multiple operations can be combined into a single operation, the single operation can be distributed in additional operations, and the operations can, in time, be at least partially overlapped for execution. Moreover, alternative embodiments can include multiple instances of a specific operation, and the order of the operations can be altered in various other embodiments. However, other modifications, variations, and replacements are also possible. Therefore, the specification and drawings should be regarded as illustrative rather than restrictive.

Although some specific embodiments of the present disclosure have been described in detail by means of examples, it should be understood by those skilled in the art that the above examples are for illustration only and are not intended to limit the scope of the present disclosure. The various embodiments disclosed herein can be combined arbitrarily without departing from the spirit and scope of the present disclosure. It should also be understood by those skilled in the art that various modifications can be made to the embodiments without departing from the scope and spirit of the present disclosure. The scope of the present disclosure is defined by the claims attached therein.

What is claimed is:

1. A method for up-converting a clock signal, comprising:
employing a first clock sub-circuit to provide a clock signal having a first frequency to a chip;
receiving an instruction to up-convert the clock signal having the first frequency to a clock signal having a second frequency; and
in response to receiving the instruction and in response to determining that directly causing the first clock sub-circuit to output the clock signal having the second frequency would cause the first clock sub-circuit to output an intermediate frequency other than the first frequency and the second frequency:
causing a second clock sub-circuit to output the clock signal having the second frequency; and
after the second clock sub-circuit outputs the clock signal having the second frequency, employing the second clock sub-circuit to provide the clock signal having the second frequency to the chip in place of the first clock sub-circuit;

wherein the first clock sub-circuit comprises a first oscillator and a first frequency divider that divides an output of the first oscillator, the first clock sub-circuit is configured to provide the clock signal having the frequency in the case where the first oscillator operates in its optimal frequency range; and wherein the second clock sub-circuit comprises a second oscillator and a second frequency divider that divides an output of the second oscillator, the second clock sub-circuit is configured to provide the clock signal having the second frequency in the case where the second oscillator operates in its optimal frequency range.

2. The method according to claim 1, further comprising:
after employing the second clock sub-circuit to provide the clock signal having the second frequency to the chip in place of the first clock sub-circuit, causing the first clock sub-circuit to output the clock signal having the second frequency; and
after the first clock sub-circuit outputs the clock signal having the second frequency, employing the first clock sub-circuit to provide the clock signal having the second frequency to the chip in place of the second clock sub-circuit.

3. The method according to claim 1, further comprising:
receiving a second instruction to up-convert the clock signal having the second frequency to a clock signal having a third frequency;
in response to receiving the second instruction, causing another clock sub-circuit other than a clock sub-circuit currently providing the second frequency to output the clock signal having the third frequency; and
after the another clock sub-circuit outputs the clock signal having the third frequency, employing the another clock sub-circuit to provide the clock signal having the third frequency to the chip in place of the clock sub-circuit currently providing the second frequency.

4. A method for up-converting a clock signal, comprising:
employing a first clock sub-circuit to provide a clock signal having a first frequency to a chip;
receiving an instruction to up-convert the clock signal having the first frequency to a clock signal having a second frequency; and
in response to receiving the instruction and in response to determining that directly causing the first clock sub-circuit to output the clock signal having the second frequency would cause the first clock sub-circuit to output an intermediate frequency other than the first frequency and the second frequency:
causing the second clock sub-circuit to output the clock signal having the first frequency and provide the clock signal having the first frequency to the chip in place of the first clock sub-circuit;
causing the first clock sub-circuit to output the clock signal having the second frequency; and
after the first clock sub-circuit outputs the clock signal having the second frequency, employing the first clock sub-circuit to provide the clock signal having the second frequency to the chip;
wherein the first clock sub-circuit comprises a first oscillator and a first frequency divider that divides an output of the first oscillator, the first clock sub-circuit is configured to provide the clock signal having the first frequency and the clock signal having the second frequency in the case where the first oscillator operates in its optimal frequency range; and wherein the second clock sub-circuit comprises a second oscillator and a second frequency divider that divides an output of the second oscillator, the second clock sub-circuit is configured to provide the clock signal having the first frequency in the case where the second oscillator operates in its optimal frequency range.

5. A clock circuit comprising:
a first clock sub-circuit and a second clock sub-circuit configured to output a clock signal of a specified frequency;
a switching sub-circuit configured to perform switching between the first clock sub-circuit and the second clock sub-circuit; and
a configuration sub-circuit configured to:
employ the first clock sub-circuit to provide a clock signal having a first frequency to a chip;
receive an instruction to up-convert the clock signal having the first frequency to a clock signal having a second frequency; and
in response to receiving the instruction and in response to determining that directly causing the first clock sub-circuit to output the clock signal having the second frequency would cause the first clock sub-circuit to output an intermediate frequency other than the first frequency and the second frequency:
cause the second clock sub-circuit to output the clock signal having the second frequency; and
after the second clock sub-circuit outputs the clock signal having the second frequency, employ the second clock sub-circuit to provide the clock signal having the second frequency to the chip in place of the first clock sub-circuit;

wherein the first clock sub-circuit comprises a first oscillator and a first frequency divider that divides an output of the first oscillator, the first clock sub-circuit is configured to provide the clock signal having the frequency in the case where the first oscillator operates in its optimal frequency range; and wherein the second clock sub-circuit comprises a second oscillator and a second frequency divider that divides an output of the second oscillator, the second clock sub-circuit is configured to provide the clock signal having the second frequency in the case where the second oscillator operates in its optimal frequency range.

6. The clock circuit according to claim 5, wherein the configuration sub-circuit is further configured to:
after employing the second clock sub-circuit to provide the clock signal having the second frequency to the chip in place of the first clock sub-circuit, cause the first clock sub-circuit to output the clock signal having the second frequency; and
after the first clock sub-circuit outputs the clock signal having the second frequency, employ the first clock sub-circuit to provide the clock signal having the second frequency to the chip in place of the second clock sub-circuit.

7. The clock circuit according to claim 5, wherein the configuration sub-circuit is further configured to:
in response to receiving a second instruction to up-convert the clock signal having the second frequency to a clock signal having a third frequency, cause another clock sub-circuit other than a clock sub-circuit currently providing the second frequency to output the clock signal having the third frequency; and after the another clock sub-circuit outputs the clock signal having the third frequency, employ the another clock sub-circuit to provide the clock signal having the third frequency to the chip in place of the clock sub-circuit currently providing the second frequency.

8. A clock circuit comprising:
a first clock sub-circuit and a second clock sub-circuit configured to output a clock signal of a specified frequency;
a switching sub-circuit configured to perform switching between the first clock sub-circuit and the second clock sub-circuit; and
a configuration sub-circuit configured to:
  employ the first clock sub-circuit to provide a clock signal having a first frequency to a chip;
  receive an instruction to up-convert the clock signal having the first frequency to a clock signal having a second frequency; and
  in response to receiving the instruction and in response to determining that directly causing the first clock sub-circuit to output the clock signal having the second frequency would cause the first clock sub-circuit to output an intermediate frequency other than the first frequency and the second frequency:
    cause the second clock sub-circuit to output the clock signal having the first frequency and provide the clock signal having the first frequency to the chip in place of the first clock sub-circuit;
    cause the first clock sub-circuit to output the clock signal having the second frequency; and
    after the first clock sub-circuit outputs the clock signal having the second frequency, employ the first clock sub-circuit to provide the clock signal having the second frequency to the chip;
  wherein the first clock sub-circuit comprises a first oscillator and a first frequency divider that divides an output of the first oscillator, the first clock sub-circuit is configured to provide the clock signal having the first frequency and the clock signal having the second frequency in the case where the first oscillator operates in its optimal frequency range; and
  the second clock sub-circuit comprises a second oscillator and a second frequency divider that divides an output of the second oscillator, the second clock sub-circuit is configured to provide the clock signal having the first frequency in the case where the second oscillator operates in its optimal frequency range.

9. A digital processing device comprising the clock circuit according to claim 5.

\* \* \* \* \*